United States Patent
Moy et al.

(10) Patent No.: US 7,737,546 B2
(45) Date of Patent: Jun. 15, 2010

(54) SURFACE MOUNTABLE SEMICONDUCTOR PACKAGE WITH SOLDER BONDING FEATURES

(75) Inventors: Wai Hoong Moy, Penang (MY); Chu Kun Tan, Penang (MY); Keh Chin Seah, Penang (MY); Paul Beng Hui Oh, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 351 days.

(21) Appl. No.: 11/850,526

(22) Filed: Sep. 5, 2007

(65) Prior Publication Data

US 2009/0057850 A1 Mar. 5, 2009

(51) Int. Cl.
*H01L 23/48* (2006.01)
*H01L 21/50* (2006.01)

(52) U.S. Cl. ............. 257/696; 257/779; 257/E23.048; 257/E21.506; 257/E21.509; 438/123

(58) Field of Classification Search .................. None
See application file for complete search history.

(56) References Cited

U.S. PATENT DOCUMENTS

| | | | | |
|---|---|---|---|---|
| 4,209,358 A | * | 6/1980 | DiLeo et al. | 156/293 |
| 4,722,470 A | * | 2/1988 | Johary | 228/180.21 |
| 5,041,901 A | * | 8/1991 | Kitano et al. | 257/779 |
| 5,367,124 A | * | 11/1994 | Hoffman et al. | 174/552 |
| 5,455,446 A | * | 10/1995 | Suppelsa et al. | 257/467 |
| 6,300,678 B1 | * | 10/2001 | Suehiro et al. | 257/697 |

FOREIGN PATENT DOCUMENTS

| | | | |
|---|---|---|---|
| JP | 62-166552 | * | 7/1987 |
| JP | 63-132464 | * | 6/1988 |
| JP | 2-109356 | * | 10/1988 |
| JP | 2-144952 | * | 6/1990 |
| JP | 5-243327 | * | 9/1993 |
| JP | 6-37441 | * | 2/1994 |
| JP | 10-41192 | * | 2/1998 |

OTHER PUBLICATIONS

Machine Translation of JP 10-41192, Rohm Co., Ltd., Feb. 1998.*

* cited by examiner

*Primary Examiner*—Scott B Geyer

(57) ABSTRACT

A packaged circuit element such as an LED and a method for making the same are disclosed. The packaged circuit element includes a lead frame, a molded body, and a die containing the circuit element. The lead frame has first and second leads, each lead having first and second portions. The molded body surrounds the first portion of each lead, and the die is connected electrically to the first and second leads on the first portions of the first and second leads. The second portion of each of the first and second leads is substantially parallel to opposing side surfaces of the body and include a feature that inhibits molten solder from wetting a portion of the second section of each lead between the feature and the first portion of that lead while allowing the molten solder to wet the remaining surfaces of the second portions.

17 Claims, 4 Drawing Sheets

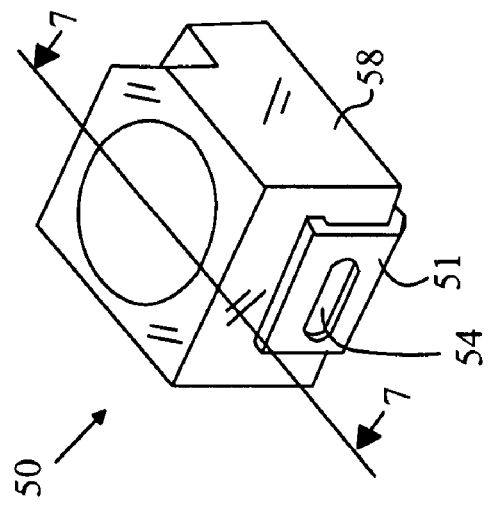
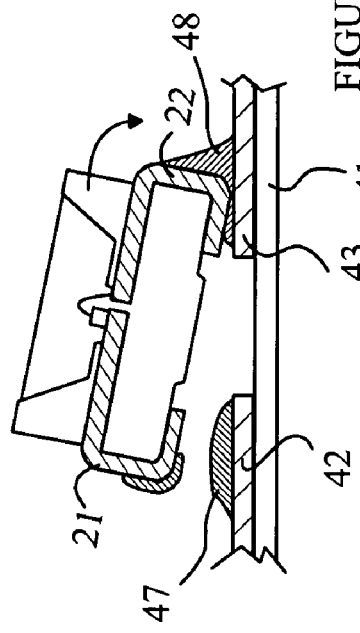
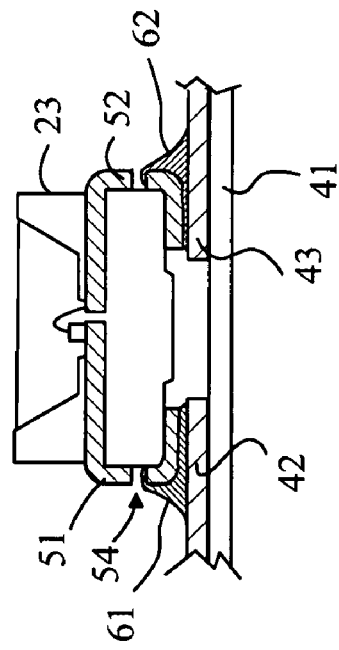

SURFACE MOUNTABLE SEMICONDUCTOR PACKAGE WITH SOLDER BONDING FEATURES

BACKGROUND OF THE INVENTION

Light-emitting diodes (LEDs) are good candidates to replace incandescent and other light sources. LEDs have higher power to light conversion efficiencies than incandescent lamps and longer lifetimes. In addition, LEDs operate at relatively low voltages, and hence, are better adapted for use in many battery-powered devices. Furthermore, LEDs are a better approximation to point sources than a fluorescent source, and hence, are better adapted than fluorescent sources for lighting systems in which a point light source that is collimated or focused by an optical system is required.

LED-based light sources often require multiple packaged LEDs to provide light of the desired color and intensity. The light sources require inexpensive packaging that can be easily connected to a printed circuit board or the like that contains the control circuitry for the light source as well as other components. One type of inexpensive package utilizes a lead frame that is encapsulated in a plastic body. The ends of the leads extend from the body and are wrapped around the body to provide contacts on the bottom of the package. The contacts serve both as mounting pads for the LED and electrical contacts for powering the LED.

The packaged part is attached to the printed circuit board by applying a solder paste to a corresponding pair of pads on the printed circuit board and positioning the LED over the pads such that the LED is in contact with the layer of paste. The paste and printed circuit board are then heated to a temperature that converts the solder paste to molten metal that bonds the package to the printed circuit board when the solder cools. In the molten state, the solder can exert a significant force on the small packaged LED due to the surface tension of the liquid solder. If the solder wets the two leads in an unequal manner or the amount of solder on one of the leads is significantly greater than the amount of solder on the other lead, the surface tension forces can cause the packaged part to move from its original position. In some cases, the movement can result in one end of the package being lifted off of the pad. This type of misalignment can render an assembly using the LED defective, resulting in decreased yield and/or increased repair costs.

SUMMARY OF THE INVENTION

The present invention includes a packaged circuit element and a method for making the same. The packaged circuit element includes a lead frame, a molded body, and a die containing the circuit element. The lead frame has first and second leads, each lead having first and second portions. The molded body surrounds the first portion of each lead, the molded body having a top surface, a bottom surface, and first and second opposing side surfaces. The die is connected electrically to the first and second leads on the first portions of the first and second leads. The second portion of each of the first and second leads is substantially parallel to the first and second opposing side surfaces, respectively. The second portions of each of the leads includes a feature that inhibits molten solder from wetting a portion of the second section of each lead between the feature and the first portion of that lead while allowing the molten solder to wet the remaining surfaces of the second portions of said first and second leads. In one aspect of the invention, the feature includes a hole in each of the second portions of said leads. In another aspect of the invention, the feature includes an area that is less wettable than the remainder of said second portions of said leads.

BRIEF DESCRIPTION OF THE DRAWINGS

FIG. 5 illustrates the bonding of light source 20 to the substrate when the molten solder on one lead extends significantly further up that lead than the molten solder on the other lead.

FIG. 6 is a perspective view of light source 50.

FIG. 7 is a cross-sectional view of light source 50 through line 7-7 after light source 50 has been bonded to a substrate.

DETAILED DESCRIPTION OF EMBODIMENTS OF THE INVENTION

Figure 1:
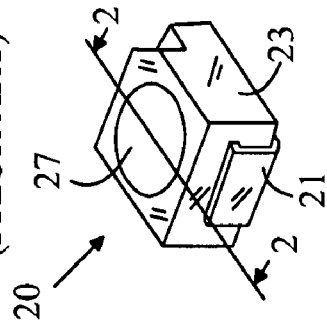
FIG. 1 is a prior art perspective view of a light source based on an LED.
Figure 2:
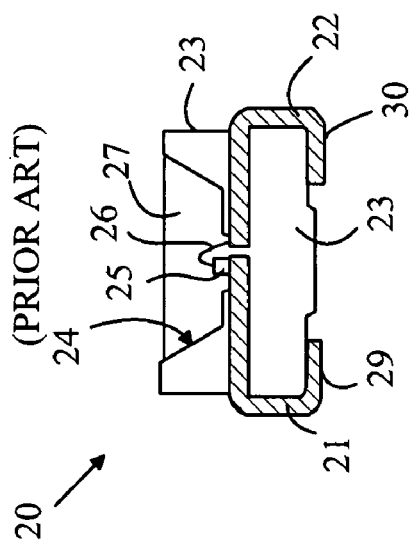
FIG. 2 is a prior art cross-sectional view of light source 20 through line 2-2 shown in FIG. 1.

The manner in which the present invention provides its advantages can be more easily understood with reference to packaged LEDs; however, the present invention can be applied to other packaged parts. FIG. 1 is a prior art perspective view of a light source based on an LED, and FIG. 2 is a prior art cross-sectional view of light source 20 through line 2-2 shown in FIG. 1. Light source 20 includes a die 25 having the LED fabricated thereon. Die 25 is mounted on a lead 21 of a lead frame and includes two contacts. The first contact is on the bottom of the die and is electrically connected to lead 21. The second contact is on the top of the die and is connected to lead 22 by wire bond 26. The lead frame is encapsulated in a plastic body 23, which includes a cup having reflective walls 24. The cup is filled with a transparent encapsulant 27. Leads 21 and 22 are bent around body 23 to provide contact surfaces 29 and 30 that are used to mount light source 20 on a substrate such as a printed circuit board.

Figure 4:
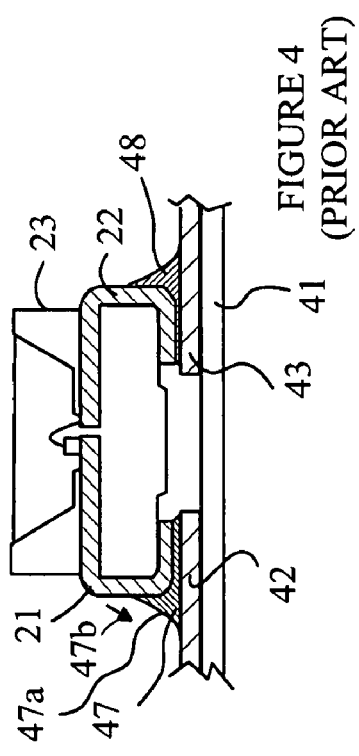
FIG. 4 is a cross-sectional view of light source 20 and the substrate after the reflow process.
Figure 3:
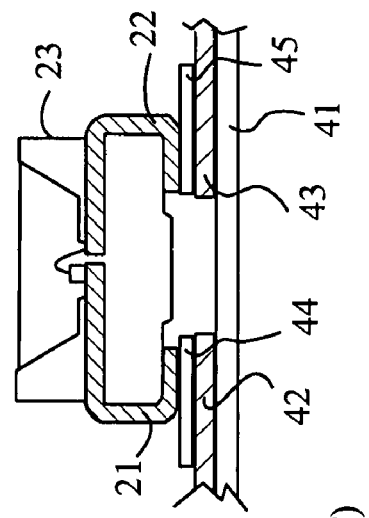
FIG. 3 is a cross-sectional view of light source 20 and the substrate prior to heating the solder paste.

Refer now to FIGS. 3 and 4, which illustrate the manner in which light source 20 is connected to a substrate 41 using a solder reflow procedure. FIG. 3 is a cross-sectional view of light source 20 and substrate 41 prior to heating the solder paste, and FIG. 4 is a cross-sectional view of light source 20 and substrate 41 after the reflow process. Substrate 41 includes two mounting pads 42 and 43 that are to be connected to leads 21 and 22, respectively. A layer of a solder paste is applied to each of the mounting pads as shown at 44 and 45 prior to placing light source 20 on the paste-covered mounting pads. The packaged LED, paste, and underlying pads are heated using an IR heat source.

Refer now to FIG. 4. The outer surface of the leads of the lead frame are constructed of a material that is wet by the molten solder. Without this wetting action, the solder bond would not form. The degree to which a liquid wets a surface is usually measured in terms of the contact angle between the surface and the surface of the liquid layer at the point of contact. Materials that have contact angles of less than 90 degrees are said to wet the surface. The smaller the contact angle, the greater the degree to which the material is said to wet the surface.

However, the wettable surface also allows the molten solder to "climb" the side of the lead, and hence, a meniscus 47a is formed between the vertical surface of the lead and the substrate to which the package is being bonded as shown. The surface tension of this meniscus exerts a force on the side of the package that tends to cause the package to be upended as indicated by arrow 47*b*. In the ideal case, there is an equal force on the other side of the package from the molten solder that is moving up the side of the lead on that side and forming an identical meniscus, and hence, the package remains in place, since the forces are balanced. In this case, a perfect bond is formed as shown in FIG. 4.

However, if one side of the package is heated more than the other side of the package, the solder will climb the side of the package faster on the hotter side, and unequal forces can result. Refer now to FIG. 5, which illustrates the bonding of light source 20 to substrate 41 when the molten solder on lead 22 extends significantly further up that lead than the molten solder on lead 21. In this case, the surface tension of the solder meniscus on joint 48 exerts a force on light source 20 that results in a torque on light source 20 that is not matched by a corresponding torque from the surface of the molten solder in joint 47. As a result, light source 20 is lifted off of pad 42 as shown in FIG. 5. FIG. 5 illustrates the case in which contact is broken between lead 21 and pad 42, and the resulting device fails. However, even if the electrical contact is maintained, the light source will be pointed in a direction that is different from the design direction.

If the package is sufficiently heavy or has a low enough center of gravity, the unequal forces will not cause significant problems. However, in the case of an LED, the package is relatively small and the center of gravity can be relatively high if a reflector is included in the package. In this case, the package can be upended and the bonding operation fails.

The present invention overcomes this problem by providing a lead frame design in which the vertical area on the side of each lead that is available for the solder to wet is substantially reduced compared to the prior art packages discussed above. As a result, the leads have more equal areas that are wet and the torque that can be applied to tip the package is also reduced. Refer now to FIGS. 6 and 7, which illustrate a light source according to one embodiment of the present invention. FIG. 6 is a perspective view of light source 50, and FIG. 7 is a cross-sectional view of light source 50 through line 7-7 after light source 50 has been bonded to a substrate. Light source 50 differs from light source 20 discussed above in that the vertical portion of each lead that is wrapped around body 58 includes a cutout that substantially reduces the area of the lead that is available for contact with the molten solder, and hence, reduces the surface tension forces that can be applied to light source 50 during solder reflow. The cutout corresponding to lead 51 is shown at 54 in the drawings.

Refer now to FIG. 7. Molten solder that would otherwise be drawn up the side of each lead is inhibited from moving past the cutouts or holes 54. Hence, the solder bonds shown at 61 and 62 terminate in the cutouts. It should be noted that lead frames normally include such cutouts within the area that is covered by the molding compound. The cutouts are used to assure that the molding material flows through the lead frame and/or bonds to the lead frame in a manner that prevents delamination of the lead frame from the molded body. Hence, the present invention does not require any new steps in the fabrication process. It should also be noted that the portions of leads 51 and 52 that are located outside of body 58 are positioned in contacting relationship with the adjacent surfaces of body 58, such that the cutouts or holes 54 terminate immediately adjacent the associated side surfaces of body 58. Thus, the side surface of body 58 blocks and inhibits the flow of solder through holes 54 preventing wetting of the inward facing surface of the associated lead with molten solder.

Figure 8:
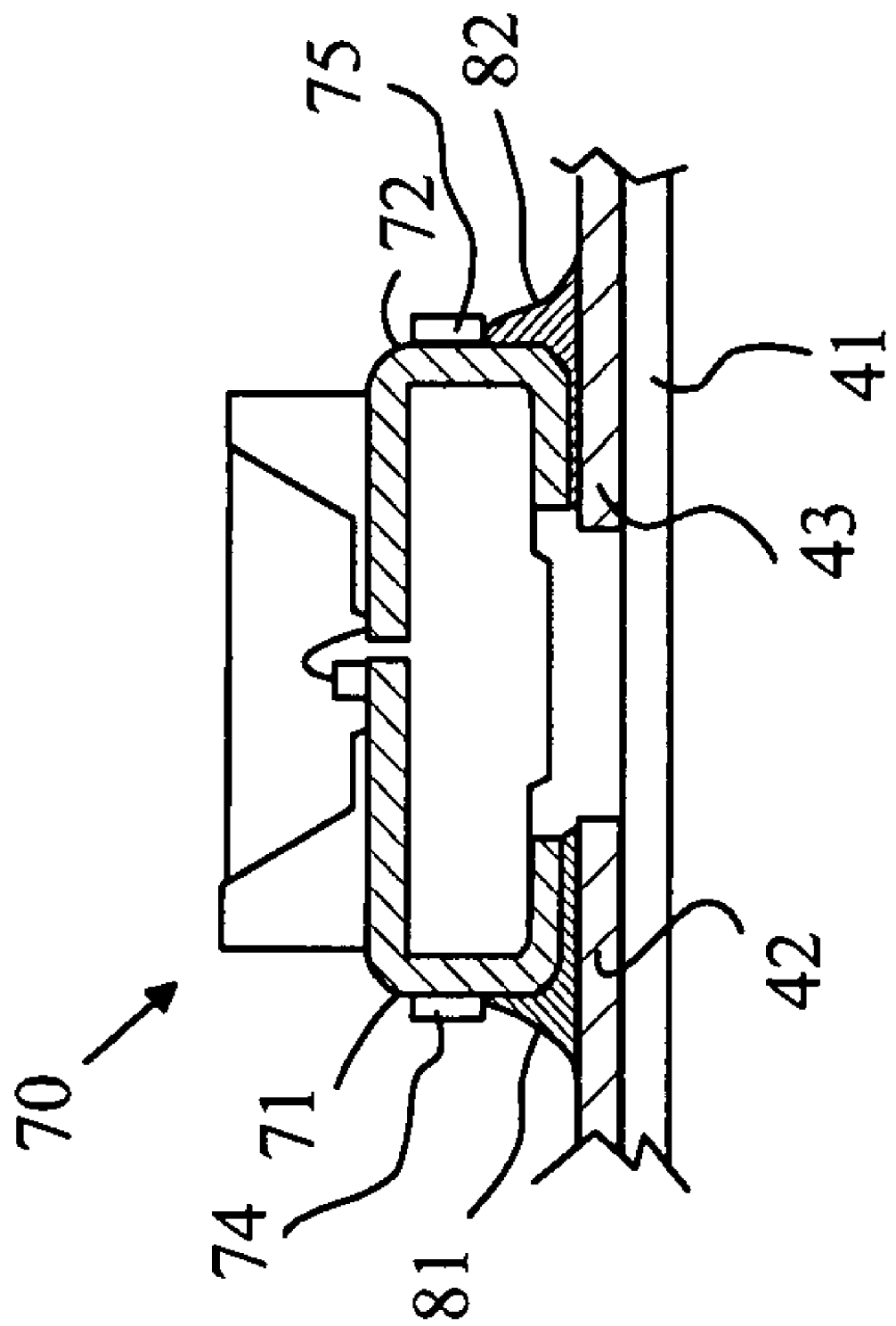
FIG. 8 is a cross-sectional view of another embodiment of a light source according to the present invention.

The above-described embodiments utilize a cutout in the vertical section of the lead to inhibit the flow of the solder up the lead. However, other forms of solder flow barriers can be utilized. In one embodiment of the present invention, the lead frame is selectively plated with a material that the solder will not wet, and hence, the solder will be inhibited from flowing past this barrier. Refer now to FIG. 8, which is a cross-sectional view of another embodiment of a light source according to the present invention. Light source 70 is constructed on a lead frame having leads 71 and 72, which serve functions analogous to those served by leads 51 and 52 and discussed above. Leads 71 and 72 are plated with a barrier material as shown at 74 and 75. The material is one that is less wettable than the material from which the remainder of the lead frame is constructed. For example, layers 71 and 72 could be constructed by plating Al onto a Cu lead frame. Since solder does not wet Al, the meniscus of the solder will not climb above barriers 71 and 72. Alternatively, a plastic or paint could be used on the lead frame to provide the barrier, provided the material can withstand the temperatures realized during the solder reflow process.

In one embodiment of the present invention, the lead frame is plated in the same material over the entire surface of the lead frame; however, the material is chosen to reduce the development of uneven forces on the two sides of the package during the solder reflow process. Solder is typically a tin-lead alloy or a tin-silver-copper alloy. For any particular solder composition, the material that is plated on the surface of the lead frame in the region in which the solder is to make contact affects the speed with which the solder wets the surface and moves upward along the vertical surface of the lead frame. If the plating material is slower to dissolve in the solder melt, the solder wetting is slowed. If the wetting occurs too quickly, the solder on one side of the die can develop a meniscus that is substantially different from that developed on the other side, and hence, lead to uneven surface tension forces being applied to the package. Hence, by utilizing a surface plating material that slows the wetting process, the difference in the meniscus areas can be reduced. For example, if a tin-silver solder is used on a tin plated lead frame, the surface plating will dissolve more slowly than in the case in which a silver-plated lead frame is utilized.

Figure 9:
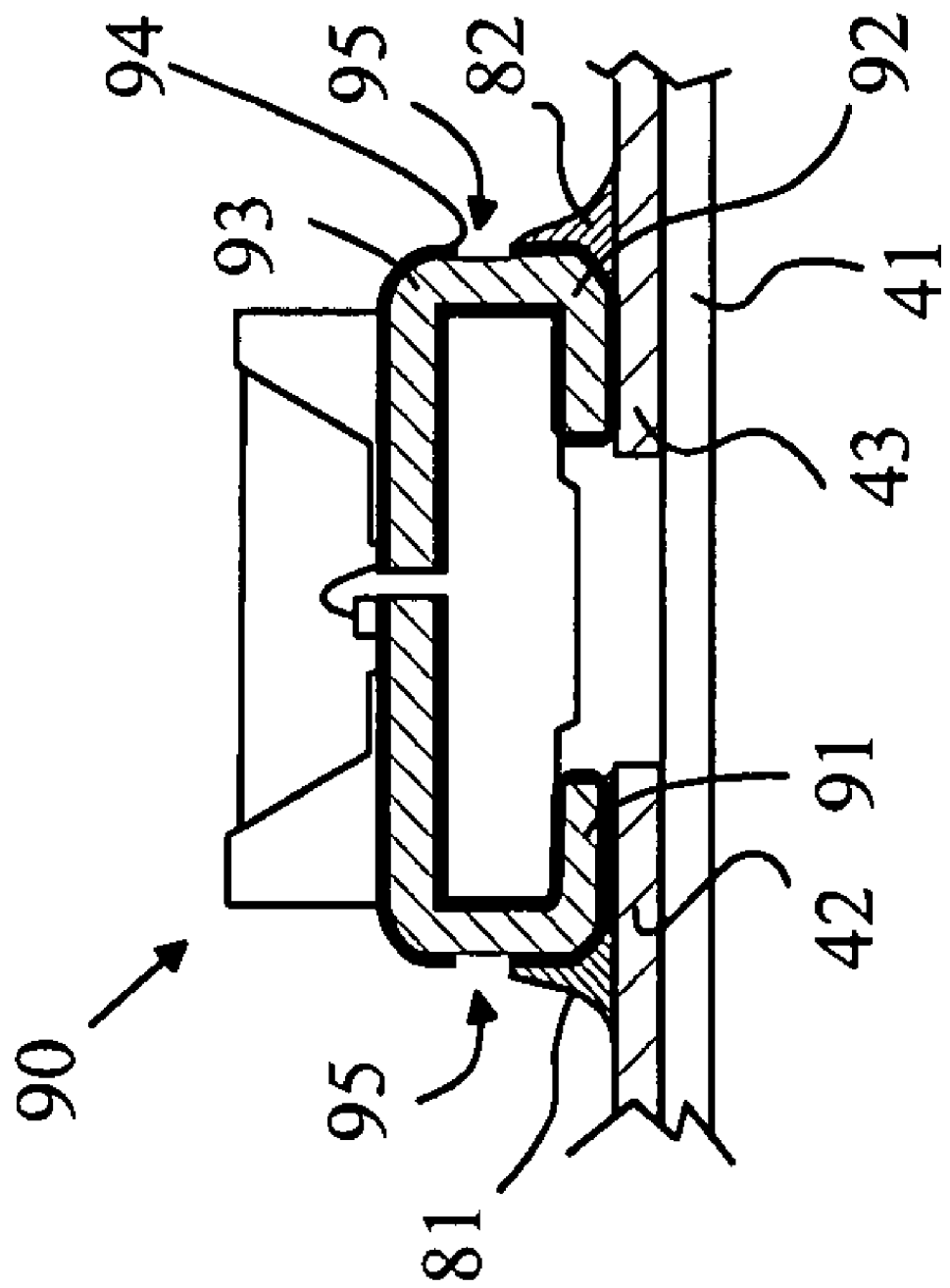
FIG. 9 is a cross-sectional view of another embodiment of a light source according to the present invention.

In the embodiment shown in FIG. 8, an extra layer of material was selectively plated on the lead frame in locations that formed a barrier to the movement of the solder meniscus up the side of the lead frame. However, embodiments in which the lead frame is selectively etched to provide the barrier can also be constructed. Refer now to FIG. 9, which is a cross-sectional view of another embodiment of a light source according to the present invention. Light source 90 differs from light source 80 in that the leads shown at 91 and 92 are constructed from a core material 93 that has been plated with a second material 94 which is more easily wet by the molten solder than the core material. The plating is removed at the locations shown at 95 to provide a barrier that inhibits the further rise of the molten solder past the point at which the barrier is formed leaving solder bonds 81 and 82 that are approximately the same height above the substrate. In many lead frame designs, the lead frame is constructed from a core material that is plated to provide additional properties such as better solder wetting. For example, the lead frame could be constructed from a copper core, which is plated with tin. Hence, the barrier requires only one additional pattern etch of the sheet of material prior to the stamping operation that creates the patterned lead frame.

In embodiments in which the die in the package dissipates a significant amount of heat, the leads of the lead frame also provide a heat conduction path for transferring the heat to the substrate on which the light source is mounted in many designs. High-powered LED light sources require good heat conduction to maintain the dies at suitable operating temperatures. To maintain the necessary heat conduction, the cross-sectional area of the lead that carries the heat from the die to the substrate should not have a significant reduction in cross-sectional area between the die and the substrate. The embodiments of the present invention that utilize a hole in the leads to inhibit solder migrating up the lead during the reflow process result in such a constriction in the heat flow path. Hence, embodiments that utilize barriers that do not require such constrictions have advantages in such high power applications.

The above-described embodiments relate to packaged light sources based on lead frame packaging. Such light sources are particularly vulnerable to misalignment due to unequal surface tension generated forces on the different sides of the package, since the packages are very small, and hence, the forces applied by the surface tension of the solder are of the same order or even greater than the weight of the packaged die. In addition, the package can have a relatively high center of gravity, and hence, are easily tipped.

However, lead frames are utilized in packaging many other semiconductor devices. The packaging features of the present invention can be applied to many such packages to prevent the misalignment or tipping problems discussed above.

Various modifications to the present invention will become apparent to those skilled in the art from the foregoing description and accompanying drawings. Accordingly, the present invention is to be limited solely by the scope of the following claims.

What is claimed is:

1. An apparatus comprising:
a lead frame having first and second leads, each lead having first and second portions;
a package comprising a molded body surrounding said first portion of each lead, said package having a top surface, a bottom surface, and first and second opposing side surfaces; and
a die comprising a circuit element, said die being connected electrically to said first and second leads on said first portions of said first and second leads,
said second portion of each of said first and second leads being substantially parallel to and contacting said first and second opposing side surfaces, respectively, wherein said second portions of each of said leads each comprises a hole that inhibits molten solder from wetting a portion of said second portion of each lead between said hole and said first portion of that lead, while allowing molten solder to wet the remainder of said second portions of said first and second leads; each said hole terminating immediately adjacent an associated one of said side surfaces of said package whereby said associated side surface inhibits molten solder flow through said hole.

2. The apparatus of claim 1 wherein said die comprises a top and a bottom surface and wherein said die is bonded to said first lead by said bottom surface.

3. The apparatus of claim 1 wherein said first and second leads each comprise a third portion, said third portion of each of said first and second leads underlying said bottom surface and being substantially parallel thereto and in contact therewith.

4. The apparatus of claim 3 wherein said feature comprises a layer of material that molten solder wets less than said second portion of said first and second leads between said feature and third portion of said first and second leads.

5. The apparatus of claim 4 wherein said surface material comprises tin or silver.

6. The apparatus of claim 3 further comprising a substrate having first and second mounting pads thereon, said third portion of each of said first and second leads being bonded to said mounting pads by a layer of solder, said solder layer extending up said first and second leads to said hole; said solder layer engaging outwardly facing surface portions and not engaging inwardly facing surface portions of said first and second leads.

7. The apparatus of claim 6 wherein said solder comprises a plurality of components and where said leads comprise a surface material comprising one of said solder components.

8. The apparatus of claim 7 wherein said die comprises an LED.

9. The apparatus of claim 7 wherein said solder comprises tin and wherein said surface material comprises tin.

10. The apparatus of claim 7 wherein said feature comprises an area on said second portion of each of said first and second leads that has a surface that is wet less by said molten solder than the remainder of said second portion of said first and second leads.

11. The apparatus of claim 1 wherein said die comprises an LED.

12. The apparatus of claim 1 wherein said first and second leads comprise a core material that is coated with a surface material and wherein said feature comprises an exposed portion of said core material.

13. A method for packaging a die having a circuit element thereon, said method comprising:
providing a lead frame having first and second leads, each lead having first and second portions;
molding a body surrounding said first portion of each lead to form a package, said package having a top surface, a bottom surface, and first and second opposing side surfaces; and
attaching said die to said leads, said die being connected electrically to said first and second leads on said first portion of each of said first and second leads,
bending said leads such that said second portion of each of said first and second leads is substantially parallel to and contacting said first and second opposing side surfaces, respectively, wherein said first and second portions of each of said leads each comprises a hole that inhibits molten solder from wetting a portion of said second portion of each lead between said hole and said first portion of that lead; each said hole terminating immediately adjacent an associated one of said side surfaces of said package whereby said associated side surface inhibits molten solder flow through said hole.

14. The method of claim 13 wherein said first and second leads each comprise a third portion, said third portion of each of said first and second leads being bent such that said third portions of each of said first and second leads underlie said bottom surface and being substantially parallel thereto and in contact therewith.

15. The method of claim 14 wherein said feature comprises a layer of material that molten solder wets less than said second portion of said first and second leads between said feature and said third portion of said first and second leads.

16. The method of claim 15 wherein said surface material comprises tin or silver.

17. The method of claim 13 wherein said first and second leads comprise a core material that is coated with a surface material and wherein said feature comprises an exposed portion of said core material.

* * * * *